United States Patent
Boggs et al.

(10) Patent No.: US 6,667,090 B2
(45) Date of Patent: Dec. 23, 2003

(54) COUPON REGISTRATION MECHANISM AND METHOD

(75) Inventors: David W. Boggs, Hillsboro, OR (US); Rebecca A. Jessep, Dallas, OR (US); Carolyn McCormick, Hillsboro, OR (US); Daryl A. Sato, Beaverton, OR (US); John H. Dungan, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/962,152

(22) Filed: Sep. 26, 2001

(65) Prior Publication Data

US 2003/0056365 A1 Mar. 27, 2003

(51) Int. Cl.[7] .................................................. B32B 3/10
(52) U.S. Cl. ........................ 428/131; 428/66.6; 428/209; 428/901
(58) Field of Search ............................... 428/209, 901, 428/66.6, 131; 174/253, 254, 260

(56) References Cited

U.S. PATENT DOCUMENTS

| | | | |
|---|---|---|---|
| 5,222,305 A | | 6/1993 | Guth |
| 5,517,756 A | * | 5/1996 | Shirai et al. .................... 29/847 |
| 5,710,063 A | * | 1/1998 | Forehand et al. ............ 437/308 |
| 6,115,910 A | | 9/2000 | Ghahghahi |
| 6,162,365 A | | 12/2000 | Bhatt et al. |
| 6,180,215 B1 | | 1/2001 | Sprietsma et al. |
| 6,281,090 B1 | | 8/2001 | Kukanskis et al. |
| 6,437,669 B1 | * | 8/2002 | Welstand et al. ............ 333/246 |

FOREIGN PATENT DOCUMENTS

| | | |
|---|---|---|
| JP | 02094691 | 4/1990 |
| JP | 02125490 | 5/1990 |
| JP | 05063318 | 3/1993 |
| JP | 11307890 | 2/2000 |

OTHER PUBLICATIONS

Kotaro Takigami, U.S. patent application Publication No. US 2001/0000100A1, Apr. 5, 2001.

* cited by examiner

*Primary Examiner*—Cathy Lam
(74) *Attorney, Agent, or Firm*—Schwegman, Lundberg, Woessner & Kluth, P.A.

(57) ABSTRACT

A registration coupon is provided for a printed circuit board or other substrate. The registration coupon may be used to determine a hole-to-outer layer feature registration and a solder mask registration. The registration coupon may include a registration hole provided on the circuit board, a metal pad and an anti-pad provided on the circuit board about the registration hole, and a solder mask covering the metal pad.

26 Claims, 8 Drawing Sheets

COUPON REGISTRATION MECHANISM AND METHOD

FIELD

The present invention is directed to the field of printed circuit board fabrication. More particularly, the present invention is directed to a pattern design (such as a registration coupon mechanism) that allows real time external feature registration assessment.

BACKGROUND

Electronic systems (e.g., computers, printers, etc.) may be designed with one or more printed circuit boards that are electrically connected together to perform various functions. Manufacturers may follow a well-established circuit board assembly procedure in order to manufacture and assemble a fully functional circuit board. This circuit board assembly procedure may have four sequential stages of which the second, third and fourth stages are performed in an assembly line environment while the first stage is performed beforehand, normally at an off-line site, in an effort to speed up the assembly line stages.

The first stage may involve programming various programmable electronic components using well-known manual or automated equipment operated by one or more persons. These programmable electronic components include, but are not limited to, read-only memory ("ROM"), erasable programmable read-only memory ("EPROM") and electrically erasable and re-programmable nonvolatile memory (typically referred to as "flash" memory). Afterwards, electronic components may be connected to the circuit board during the second or third stages.

The second and third stages may involve assembly of the circuit board by connecting surface mount technology ("SMT") components followed by through hole mount technology ("THMT") components through various widely known techniques. For example, the technique for connecting SMT components to the circuit board may include the following operations: (i) solder paste application, (ii) proper placement of the SMT components, and (iii) reflow soldering to establish connections between bus lines previously routed in the circuit board and the SMT components. Likewise, the technique for connecting the THMT components may include the following operations: (i) proper placement of THMT components, and (ii) wave soldering.

The final stage in manufacturing circuit boards may involve testing each component (i.e., "in-circuit" testing) as well as the entire operation of the circuit board (i.e., "functional" testing) to determine whether the circuit board is functioning properly.

It is desirable to notice defects in a printed circuit board (PCB) early in the manufacturing and assembling processes so as to avoid unnecessary assembly. That is, defects may arise from misregistration of holes, vias, pads and/or components. For example, misregistration may occur if drilled holes are not properly registered with outer layer pads or if a solder mask is not properly registered with outer layer pads. If a printed circuit board is defective, then it may be a waste of time and money to mount electronic components on the circuit board since the circuit board may be discarded or returned to the manufacturer due to its defect. It is therefore desirable for an easy and efficient mechanism and method to identify defective printed circuit boards.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein.

DETAILED DESCRIPTION

In the following detailed description, like reference numerals and characters may be used to designate identical, corresponding or similar components in differing figure drawings. Where specific details are set forth in order to describe example embodiments of the invention, it should be apparent to one skilled in the art that the invention can be practiced without, or with variation of, these specific details. The features shown in the figures are not drawn to scale.

Embodiments of the present invention relate to a registration mechanism on a substrate such as a printed circuit board. While embodiments of the present invention may discuss a printed circuit board, the present invention is not limited to that type of substrate. Other substrates include outriggers, multipacks (both used portions and unused portions) or other types of carriers, for example.

Figure 1:
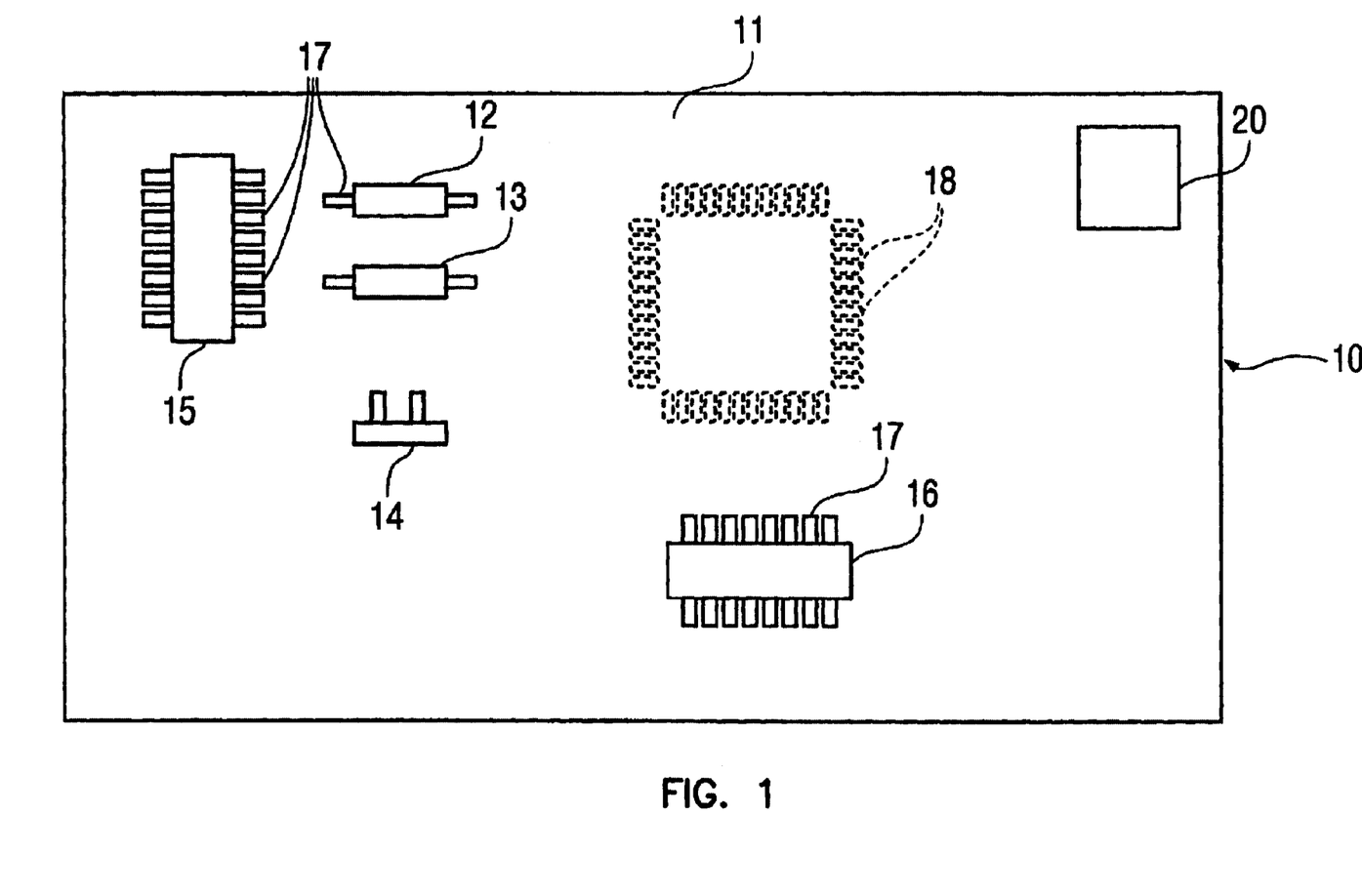
FIG. 1 is a printed circuit board design according to an example embodiment of the present invention.

FIG. 1 illustrates a printed circuit board according to an example embodiment of the present invention. Other embodiments and configurations are also within the scope of the present invention. More specifically, FIG. 1 shows a printed circuit board 10 having at least one, and typically a plurality of circuit components, located adjacent a first or front surface 11 of the circuit board 10. The components may include, for example, resistors 12 and 13, a capacitor 14, integrated circuits 15 and 16, as well as any other type of circuit component, connector, or circuit module. Each through-hole circuit component may have electrically conductive component leads 17. Each of the component leads 17 may extend from an associated component and through corresponding lead holes formed through the printed circuit board 10. These holes may hereafter be referred to as holes for through-hole mount components. The printed circuit board 10 may also include a plurality of electrically conductive pads 18 disposed at predetermined locations. The printed circuit board 10 may also include a registration coupon 20 located adjacent the front surface 11. In accordance with embodiments of the present invention, the registration coupon 20 may be provided on the printed circuit board 10 prior to the mounting of the resistors 12, 13, the capacitor 14 and the integrated circuits 15, 16.

Embodiments of the present invention may provide a registration coupon (such as the registration coupon 20) for a printed circuit board. The registration coupon may include several different features that when combined form the registration coupon. These features may include a registration hole provided in the circuit board. A metal pad (such as a copper pad) may be provided over the circuit board in an area about the registration hole. A negative pattern (hereafter also called a via hole or an anti-pad or anti-pad area) may be etched from the metal pad so as to expose portions of the laminate A solder mask may later be provided over the printed circuit board including over the metal pad of the registration coupon. A clearance area may be formed on portions of the metal pad not covered by the solder mask. The formed registration coupon allows a viewer to immediately assess the quality of the critical attributes of external alignment such as the holes (or vias), outer layer pads and solder mask clearances. The visual inspection may be made at any point during the manufacturing or assembly process in order to determine whether the printed circuit board passes as a properly registered circuit board or fails as an improperly registered circuit board.

Figure 2:
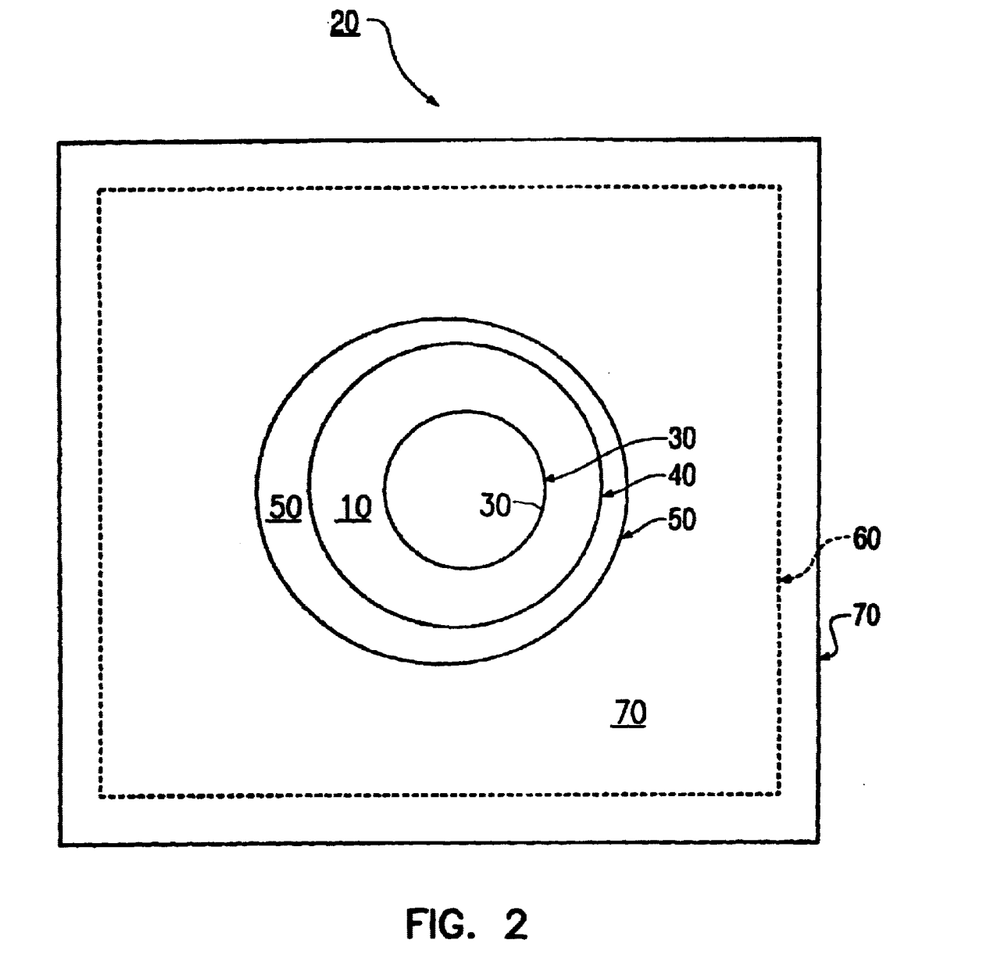
FIG. 2 illustrates a registration coupon according to an example embodiment of the present invention.

FIG. 2 illustrates a registration coupon according to an example embodiment of the present invention of the present invention. Other embodiments and configurations of the registration coupon are also within the scope of the present invention. More specifically. FIG. 2 shows the registration coupon 20 includes a registration hole 30 provided on the printed circuit board 10. The registration hole 30 maybe drilled (or formed) at the same time as the other holes (such as holes for through-hole mount components) in the printed circuit board 10. A location of the registration hole 30 relative to other components of the registration coupon 20 maybe used to determine proper or improper registration of the punted circuit board 10. This may correspond to the proper registration of the other holes (such as the holes far through-hole mount components) relative to certain circuit board features. The registration coupon 20 also includes an etched via hole 40 in metal pad 44, a solder mask clearance area 50, a solder mask (over metal) 60 and a solder mask 70. The solder mask (over metal) 60 and the solder mask 70 may be a single solder mask; however, for ease of illustration, the solder mask is labeled as being the solder mask (over metal) 60 for portions of the solder mask covering the metal pad and as the solder mask 70 for portions of the solder mask that are not covering the metal pad. Although not visible in FIG. 2, the registration coupon 20 includes metal pad 44 (such as a copper pad) provided within an area under the surface of the solder mask (over metal) 60. Portions of this metal pad are etched to form the section corresponding to the etched via hole 40. The via hole 40 corresponds to the exposed bare laminate of the printed circuit board 10. The metal pad (also may be called an outer layer pad) is thereby provided within an area under the solder mask (over metal) 60 without being in the area of the etched via hole 40. The via hole 40 and the metal pad (i.e., the outer layer pad of the registration coupon 20) are imaged and etched at substantially the same time and using the same procedure as other PCB circuit features.

The registration hole 30 may be the smallest drilled hole on the printed circuit board 10, although embodiments of the present invention are also applicable to the registration hole 30 being of the same or even larger size than the other holes of the printed circuit board 10. The hole size may be visually acceptable for unaided inspection. That is, the hole may be of sufficient size that it may be viewed without the use of magnification tools. As one example, the registration hole 30 has a diameter of 50 mil. In at least one embodiment, the registration hole 30 may be non-plated to avoid wasting plating materials, although embodiments of the present invention are also applicable to the registration hole 30 being plated in a similar manner to the other holes of the printed circuit board 10.

In addition to other pads and PCB circuit features being imaged and/or created during an outer-layer imaging process of the printed circuit board 10, a metal pad 44 (of the registration coupon 20) maybe imaged and etched to form the via hole 40. That is, the via hole 40 represents the exposed bare laminate of the printed circuit board 10. As one example, the registration coupon 20 may include a 4.0 mil drilled hole-to-outer layer annular ring that refers to the amount of area per side (larger than the drilled hole) for designing the via hole 40. Accordingly, the via hole 40 design may have an 8.0 mil diameter larger than the registration hole 30. The 8.0 mil larger in diameter provides a 4.0 mil annular ring. Thus, the outer layer via hole 40 may have a circular shape with a 58 mil diameter, for example. The via hole 40 may have other critical attributes/dimensions to assess the drilled hole-to-outer layer pad registration.

The solder mask clearance area 50 is the exposed metal (such as copper) or the portion of the registration coupon's metal pad that has not been etched and is not covered by the solder mask (over metal) 60. The solder mask clearance area 50 may have a circular shape, for example, although other shapes are also within the scope of the present invention. The solder mask clearance area 50 may have a diameter designed to be the diameter of the outer layer via hole 40 plus that required by the minimum solder mask registration specification. As one example, the solder mask clearance area 50 may have a +/−3.0 mil solder mask registration. As such, the solder mask clearance pad may have a diameter of 64 mil, although other diameters are also within the scope of the scope of the present invention.

Although FIG. 2 shows a circular via hole 40 and a circular solder mask clearance area 50, embodiments of the present invention are also applicable to other shapes for these features of the registration coupon 20. These features may be designed for unaided visual inspection with larger attributes or smaller features requiring magnification for inspection.

The registration coupon 20 may be visually inspected at any time during the assembling or manufacturing process to determine if features of the PCB 10 are properly registered or are improperly registered. In one embodiment, this visual inspection may be performed at the end of the PCB manufacturing process before assembly of printed circuit board components. The visual inspection may involve observing the location of the solder mask clearance relative to the solder mask (over metal) 60 and observing the location of the registration hole 30 relative to a metal edge of the via hole 40. This may be done by visually observing the top or bottom surface of the printed circuit board 10 so as to view the inspection locations and/or relations of the features of the registration coupon 20. The visual observation will now be described using the examples shown in FIGS. 3–5.

During the inspection (or observation) of the registration coupon 20, the following tests may be performed: (1) a hole-to-outer layer feature registration test; and (2) a solder mask registration test. Other tests are also within the scope of the present invention. The following discussion relates to components of the registration coupon 20 touching or covering other features of the registration coupon 20. One skilled in the art would understand that this corresponds to visually observing components and determining whether the components visually appear to touch/overlay each other.

The PCB 10 may pass the hole-to-outer layer feature regisiration test if the registration hole 30 does not visually touch the edge of the exposed metal, namely the metal edge of the via hole 40 of pad 44. The PCB 10 may fail the hole-to-outer layer feature registration test if the registration hole 30 visually touches the edge of the exposed metal (i.e., the metal edge of the via hole 40). On the other hand, the PCB 10 may pass the solder mask registration test if the perimeter of the exposed metal (i.e., the solder mask clearance area 50) is visible. The PCB 10 may fail the solder mask registration test if a full perimeter of the exposed metal (i.e., solder mask clearance pad 50) is not visible. The exposed metal for registration assessment is the functional criteria and is easily identified.

Stated differently, the visual inspection involves the location of the registration hole relative to the metal edge of the via hole 40 and the location (or formation) of the solder mask clearance area relative to the outer layer pad. One skilled in the art would understand that the visual observation would differ if different shapes are used for the via hole and the solder mask clearance area.

Figure 3:
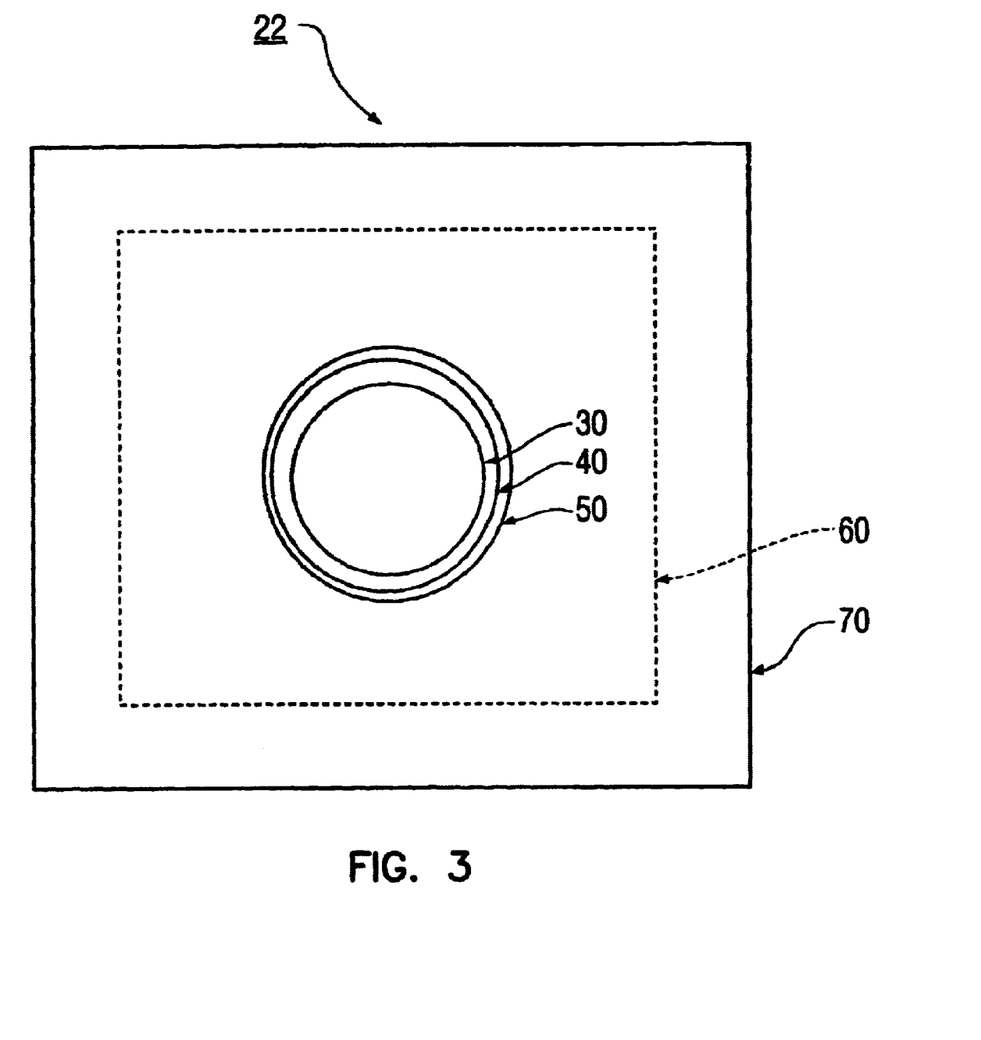
FIG. 3 illustrates a registration coupon that passes two registration tests according to an example embodiment of the present invention.

FIG. 3 illustrates a registration coupon 22 that passes the two registration tests according to an example embodiment of the present invention. More specifically, FIG. 3 shows that the registration hole 30 is visually provided within the perimeter (or circumference) of the etched via hole 40 and in an area that does not visually touch the metal edge of the via hole 40. Accordingly, the registration coupon 22 (and thus the PCB 10) passes the hole-to-outer layer pad registration test because the registration hole 30 does visually touch the exposed metal (i.e., the metal edge of the via hole 40) of pad 44. The registration coupon 22 passes the solder mask registration test because the hill perimeter (or circumference) of the exposed metal of pad 44 (i.e., the solder mask clearance area 50) is visible.

Figure 4:
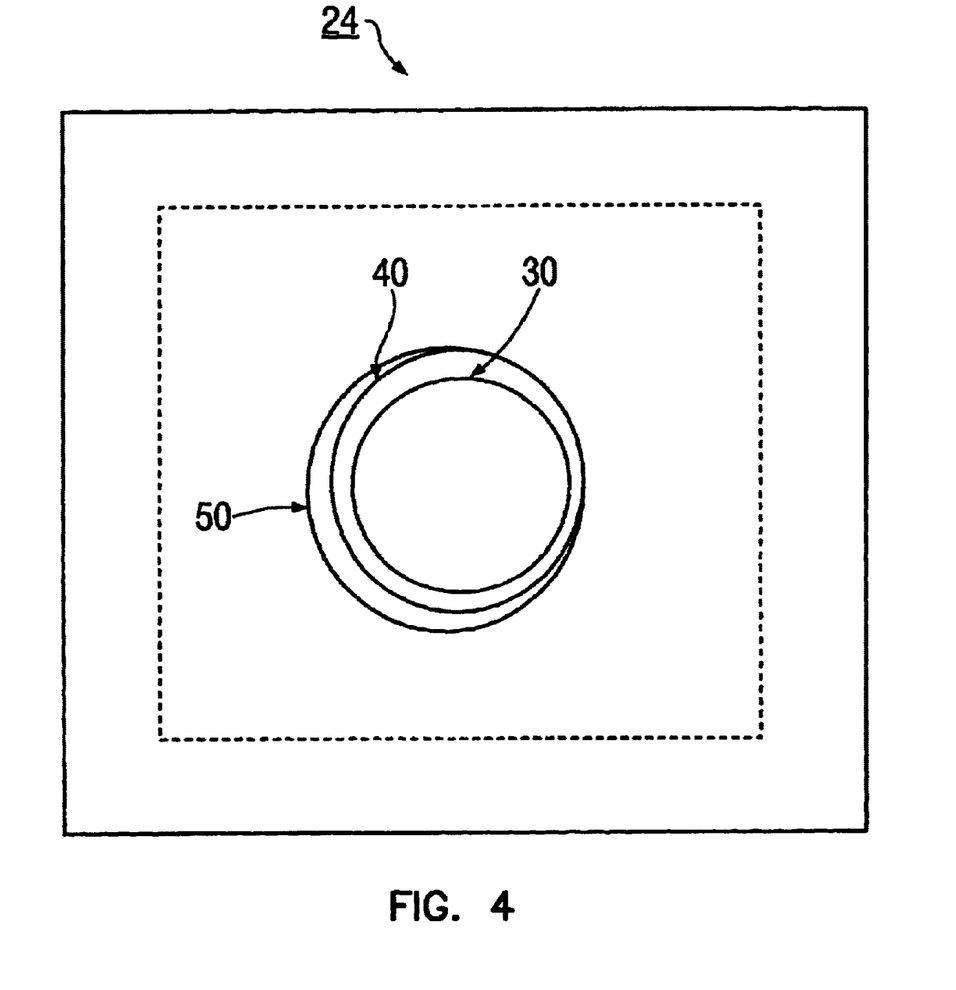
FIG. 4 illustrates a registration coupon that fails one of the registration tests according to an example embodiment of the present invention.

FIG. 4 illustrates a registration coupon 24 that fails one of the two registration tests according to an example embodiment of the present invention. More specifically, FIG. 4 shows that the registration hole 30 is visually provided within the perimeter (or circumference) of the etched via hole 40, but the solder mask clearance area 50 does not visually form a full angular ring of metal about the via hole 40. That is, the solder mask (over metal) 60 visually covers a portion of the solder mask clearance area 50 and prevents a full metal annular ring from being observed. Accordingly, the registration coupon 24 (and thus the PCB 10) fails the solder mask registration test because the full perimeter (or circumference) of the exposed metal of pad 44 (i e., the solder mask clearance area 50) is not completely visible.

Figure 5:
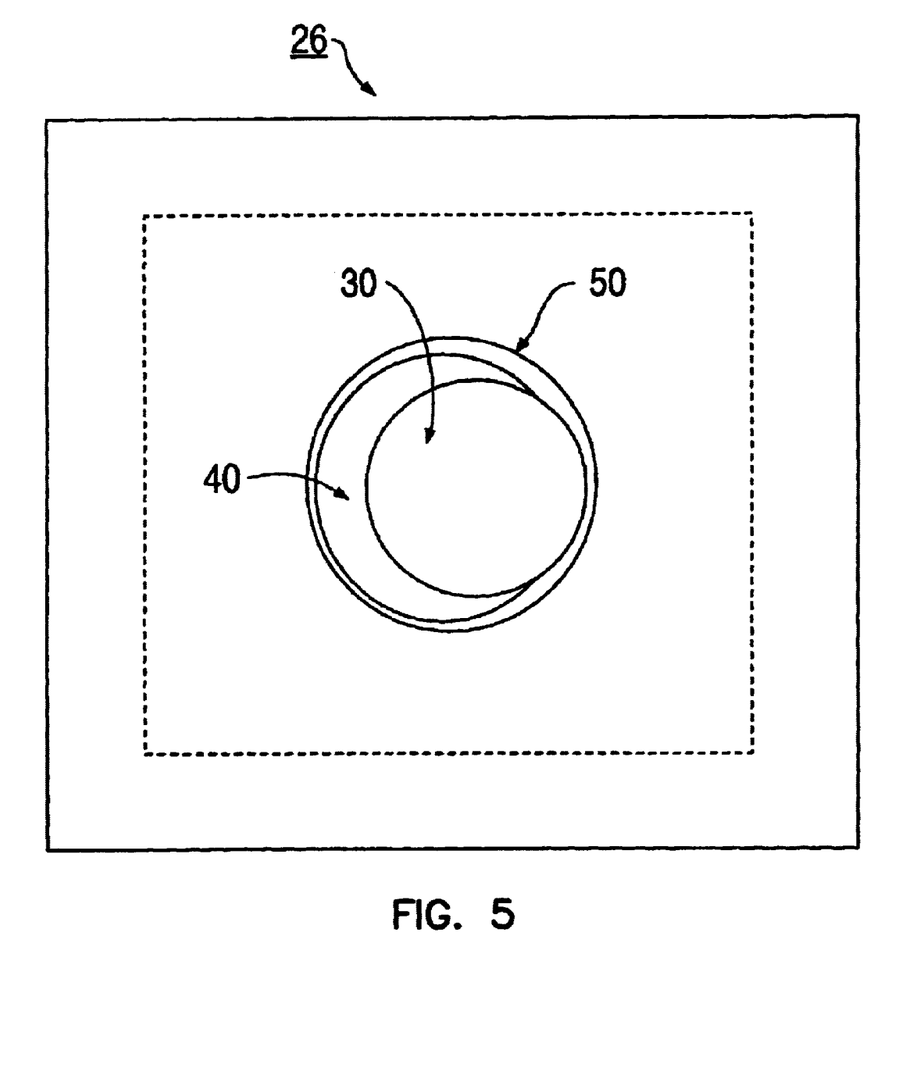
FIG. 5 illustrates a registration coupon that fails one of the registration tests according to an example embodiment of the present invention.

FIG. 5 illustrates a registration coupon 26 that fails one of the two registration tests according to an example embodiment of the present invention. More specifically, FIG. 5 shows that the registration hole 30 is not visually provided within the circular etched via hole 40, but rather the registration hole 30 visually touches upon the exposed metal of pad 44 (i.e., the metal edge of the via hole 40). The registration coupon 26 (and thus the PCB 10) fails the hole-to-outer layer pad registration test because the regis-tration hole 30 significantly visually overlaps the exposed metal of pad 44 (namely the solder mask clearance area 50). If the registration hole 30 visually just touches the exposed metal along the edge of the via hole 40, this would indicate tangency.

Figure 6:
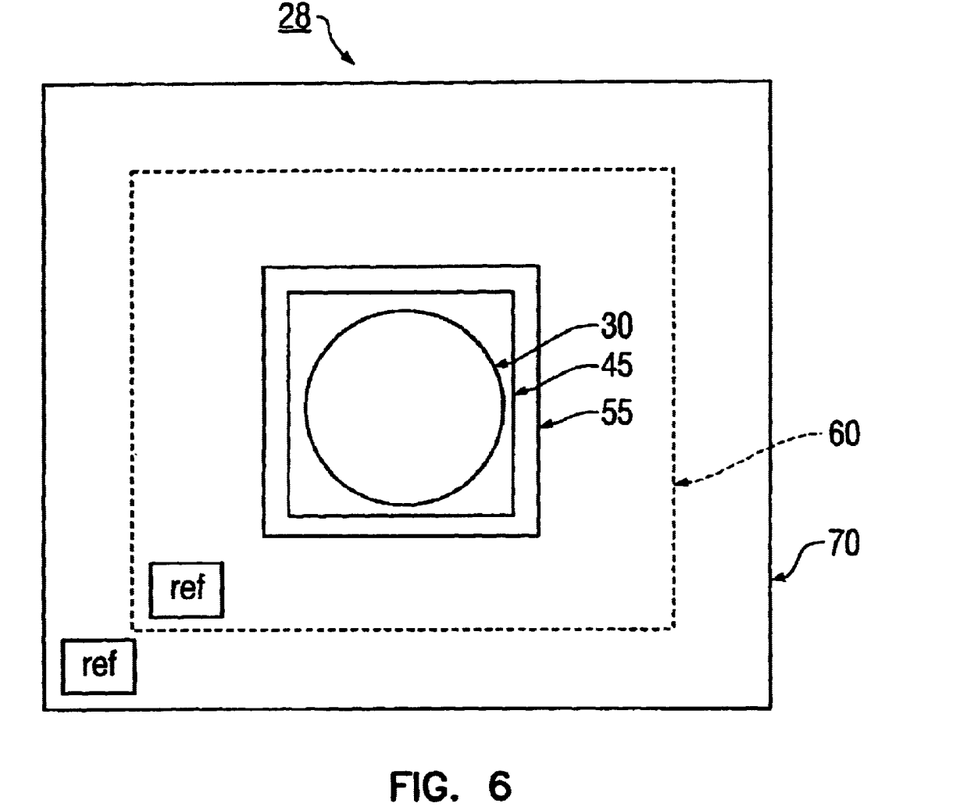
FIG. 6 illustrates a registration coupon according to another example embodiment of the present invention.

FIG. 6 illustrates a registration coupon 28 according to another example embodiment of the present invention. More specifically, FIG. 6 shows that the registration coupon 28 includes the registration hole 30, and etched via hole 45 and a solder mask clearance area 55. This embodiment shows that the etched via hole 45 and the solder mask clearance area 55 may be in the shape of a square. Other shapes are also within the scope of the present invention.

Figure 7:
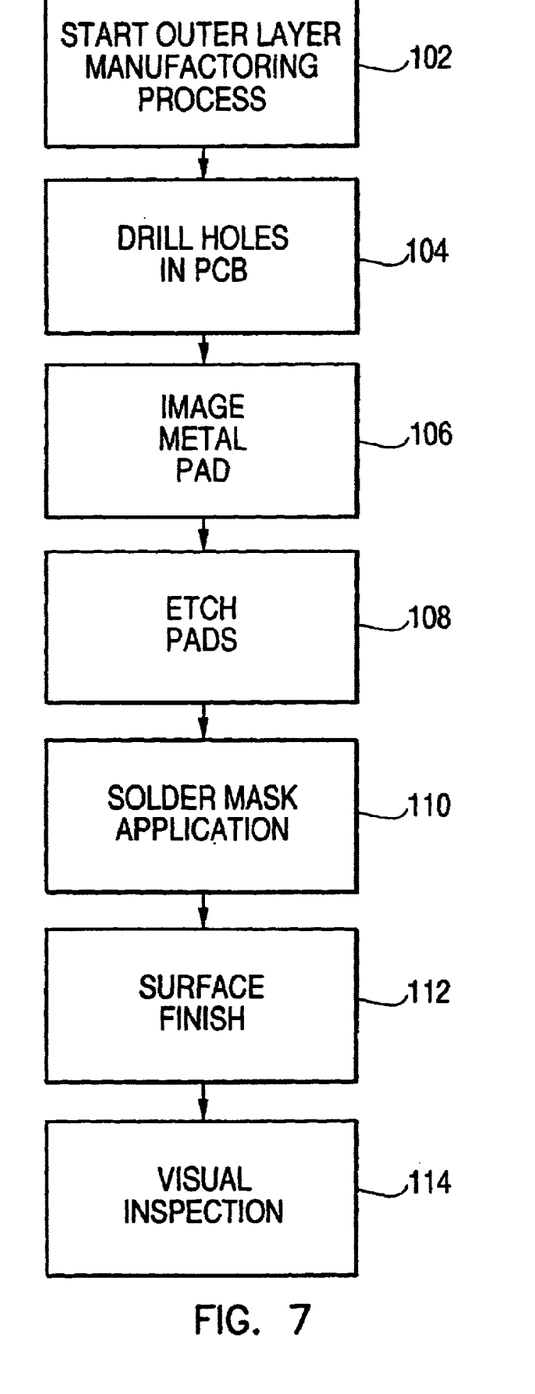
FIG. 7 is a flowchart showing operations to form and visually inspect a registration coupon according to an example embodiment of the present invention.

FIG. 7 is a flow chart showing operations to visually inspect a registration coupon according to an example embodiment of the present invention. Other embodiments, operations and orders of operations are also within the scope of the present invention. This flowchart is intended to show the operations to be performed after an inner layer manufacturing process of the PCB. That is, block 102 represents the start of the outer layer manufacturing process. Block 104 involves drilling (or forming) holes in the PCB including the registration hole 30. Copper or metal pads may be applied (or imaged) in block 106 on the PCB including the metal pad 44 and the via hole of the registration coupon 20. Metal pads may be etched in block 108 in a well-known manner. This may form the via hole 40 and other pads of the PCB. Operations in blocks 106 and 108 may also occur relatively simultaneously with one another. These operations may involve pre-cleaning of the respective areas, application of a resist, exposing the desired image and developing the desired image. As stated above, the copper pad 44 and the via hole may be imaged and etched during the same outer layer imaging process that images and forms other PCB circuit features. In block 110, a solder mask maybe applied over the PCB including over the registration coupon 20. This may also involve pre-cleaning of the surface, coating of the solder mask, tack drying the solder mask, exposing the image, developing and curing the solder mask. This thereby forms the solder mask (over metal) 60 and the solder mask 70. As stated above, the solder mask may be applied and imaged over the registration coupon features at the same time that the solder mask is applied and imaged over other features of the PCB. A surface finish may be applied over the PCB in block 112. In block 114, the registration coupon of the PCB may be visually inspected to determine whether the PCB passes or fails the registration tests as discussed above. This may involve the visual inspection of a location of the registration hole 30 relative to the metal edge of the via hole 40 as well as a visual inspection of a location of the solder mask clearance area 50 relative to the solder mask (over metal) 60.

Figure 8:
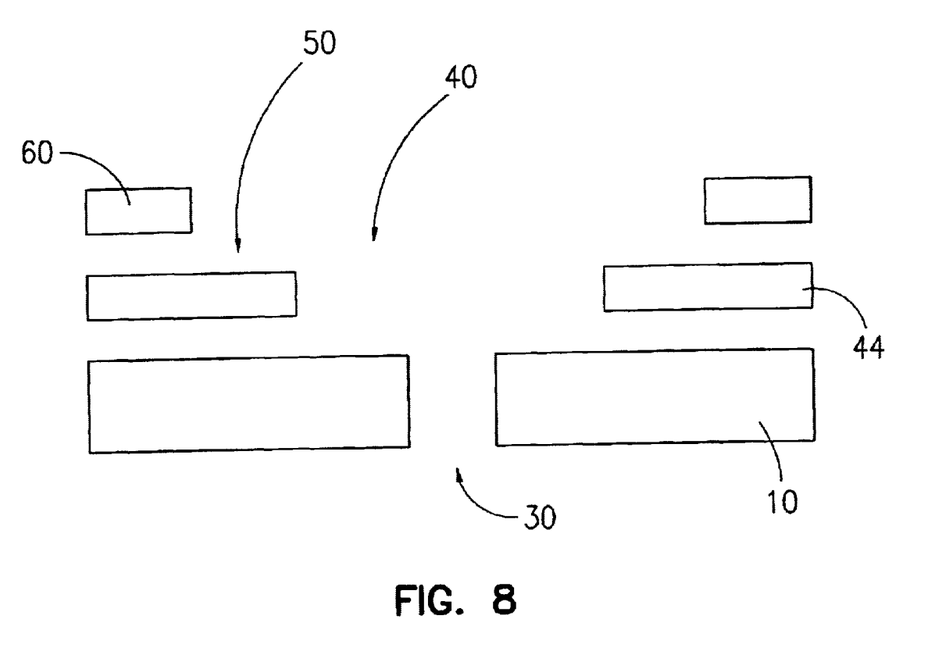
FIG. 8 is a side view of a registration coupon according to an example embodiment of the present invention.

FIG. 8 is a side view of a registration coupon according to an example embodiment of the present invention. More specifically, FIG. 8 shows the registration hole 30 provided on the printed circuit board 10. The registration coupon also includes the etched via hole 40, the solder clearance area 50 as well as the solder mask 60.

Accordingly, embodiments of the present invention provide an ability to visually assess the solder mask-to-outer layer pad registration. Embodiments also provide the ability to visually assess the drilled hole and/or vias to outer layer pad registration. The registration coupon provides for ease of outer layer feature visual inspection as pass/fail criteria. This becomes more important as feature sizes become smaller especially with ball grid array (BGA) and chip size package (CSP) devices. The solder mask registration assessment prior to assembly may be a significant benefit.

Stated differently, embodiments of the present invention allow for ease of pass/fail inspection for critical to function parameters for outer layer drilled hole/via, pads, and solder mask. Pass/fail features may be designed incorporating critical feature tolerances. The registration coupon may be strategically placed anywhere on the front or back of the PCB, such as adjacent to high-density components or as target fiducials. Each PCB may contain one registration coupon as described above or may include more than one registration coupon. The inspection may occur in real-time at the PCB fabricator or at the assembly line. Still further, by designing the go/no go feature at worst case critical tolerances, the viewer may easily visually assess outer layer registration by examining each attribute relative to each other. As discussed above, embodiments are applicable to other substrates such as multipacks and outriggers, for example.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A registration coupon for a printed circuit board, said registration coupon comprising:
    a registration hole provided in said printed circuit board;
    a metal pad provided on said printed circuit board about said registration hole;
    a via hole formed in said metal pad;
    a solder mask provided at least on said metal pad and
    a clearance area formed on portions of said metal pad not covered by said solder mask.

2. The coupon of claim 1, wherein said clearance area indicates proper registration if said clearance area comprises a visually observable integral perimeter about said via hole.

3. The coupon of claim 1, wherein said clearance area indicates improper registration if said clearance area fails to form a visually observable integral perimeter about said via hole.

4. The coupon of claim 1, wherein a location of said registration hole relative to a metal edge of the via hole indicates one of proper registration of said printed circuit board and improper registration of said printed circuit board.

5. The coupon of claim 1, wherein said via hole comprises a circular area.

6. The coupon of claim 1, wherein said via hole comprises a square area.

7. The coupon of claim 1, further comprising an annular ring visually formed by said solder mask formed over said metal pad.

8. The coupon of claim 1, wherein the metal pad, the clearance area and the solder mask are all on one surface of the printed circuit board.

9. The coupon of claim 1, wherein the registration hole is provided through the printed circuit board from one surface to the other surface of the printed circuit board.

10. A printed circuit board comprising a registration coupon provided on one face, said registration coupon to visually indicate one of proper registration of said printed circuit board and improper registration of said printed circuit board; wherein said registration coupon comprises:
    a registration hole provided in said printed circuit board
    a metal pad provided on said printed circuit board about said registration hole;
    a via hole formed in said metal pad;
    a solder mask provided at least on said metal pad; and
    a clearance area formed on portions of said metal pad not covered by said solder mask.

11. The printed circuit board of claim 10, wherein said clearance area indicates proper registration if said clearance area comprises a visually observable integral perimeter about said via hole.

12. The printed circuit board of claim 10, wherein said clearance area indicates improper registration if said clearance area fails to form a visually observable integral perimeter about said via hole.

13. The printed circuit board of claim 10, wherein a location of said registration hole relative to a metal edge of the via hole indicates one of proper registration of said printed circuit board and improper registration of said printed circuit board.

14. The printed circuit board of claim 10, wherein the metal pad, the clearance area and the solder mask are all on one surface of the printed circuit board.

15. The printed circuit board of claim 10, wherein the registration hole is provided through the printed circuit board from one surface to the other surface of the printed circuit board.

16. A method of forming a registration coupon on a printed circuit board, said method comprising:
    providing a registration hole in the printed circuit board;
    forming a metal pad and a via hole in said metal pad on said printed circuit board;
    applying a solder mask on at least said metal pad so as to form said registration coupon; and
    forming a clearance area on portions of said metal pad not covered by said solder mask.

17. The method of claim 16, further comprising visually observing said clearance area to determine one of proper registration of said printed circuit board and improper registration of said printed circuit board.

18. The method of claim 17, wherein said printed circuit board is determined to have proper registration if said clearance area comprises a visually observable integral perimeter about said via hole.

19. The method of claim 17, wherein said substrate printed circuit board is determined to have improper registration if said clearance area fails to form a visually observable integral perimeter about said via hole.

20. The method of claim 16, further comprising visually observing a location of said registration hole relative to a metal edge of the via hole to determine one of proper registration of said printed circuit board and improper registration of said printed circuit board.

21. A method of determining proper registration of a printed circuit board, said method comprising:
   providing a registration coupon in said printed circuit board, and wherein providing said registration coupon comprises:
      providing a registration hole in said printed circuit board;
      forming a metal pad and a via hole in said metal pad on said printed circuit board;
      applying a solder mask on at least said metal pad; and
      forming a clearance area on portions of said metal pad not covered by said solder mask; and
   visually observing said registration coupon on said printed circuit board so as to determine one of a proper registration of said printed circuit board and an improper registration of said printed circuit board.

22. The method of claim 21, wherein said registration comprises one of hole-to-outer layer feature registration of said printed circuit board and solder mask registration of said printed circuit board.

23. The method of claim 21, wherein visually observing said registration coupon comprises visually observing said clearance area to determine one of proper registration of said printed circuit board and improper registration of said printed circuit board.

24. The method of claim 23, wherein said printed circuit board is determined to have proper registration if said clearance area comprises an visually observable integral perimeter about said via hole.

25. The method of claim 23, wherein said printed circuit board is determined to have improper registration if said clearance area fails to form a visually observable integral perimeter about said via hole.

26. The method of claim 21, wherein visually observing said registration coupon comprises visually observing a location of said registration hole relative to a metal edge of the via hole to determine one of proper registration of said printed circuit board and improper registration of said printed circuit board.

* * * * *